United States Patent
Kim et al.

(10) Patent No.: US 10,867,992 B2
(45) Date of Patent: Dec. 15, 2020

(54) SEMICONDUCTOR APPARATUS AND SYSTEM

(71) Applicant: SK hynix Inc., Icheon-si (KR)

(72) Inventors: Joong-Ho Kim, Seongnam-si (KR); Hyun Woo Kwack, Seoul (KR); Ki Jong Lee, Icheon-si (KR); Doo Bock Lee, Seoul (KR)

(73) Assignee: SK hynix Inc., Icheon-si (KR)

( * ) Notice: Subject to any disclaimer, the term of this patent is extended or adjusted under 35 U.S.C. 154(b) by 358 days.

(21) Appl. No.: 15/855,777

(22) Filed: Dec. 27, 2017

(65) Prior Publication Data

US 2018/0358355 A1 Dec. 13, 2018

(30) Foreign Application Priority Data

Jun. 8, 2017 (KR) .................. 10-2017-0071783

(51) Int. Cl.
*H01L 27/02* (2006.01)
*H02H 9/04* (2006.01)
*H01L 25/065* (2006.01)

(52) U.S. Cl.
CPC ...... *H01L 27/0296* (2013.01); *H01L 27/0288* (2013.01); *H01L 27/0292* (2013.01); *H02H 9/046* (2013.01); *H01L 25/0657* (2013.01); *H01L 2224/32145* (2013.01); *H01L 2224/32225* (2013.01); *H01L 2224/48145* (2013.01); *H01L 2224/48227* (2013.01); *H01L 2225/0651* (2013.01); *H01L 2225/06506* (2013.01); *H01L 2225/06562* (2013.01); *H01L 2225/06586* (2013.01); *H01L 2924/15311* (2013.01)

(58) Field of Classification Search
CPC ............. H01L 25/0657; H01L 27/0288; H01L 27/0292; H01L 27/0296; H01L 2224/32145; H01L 2224/32225; H01L 2224/48145; H01L 2224/48227; H01L 2225/06506; H01L 2225/0651; H01L 2225/06562; H01L 2225/06586; H01L 2924/15311; H02H 9/046
USPC ........................................................ 361/56
See application file for complete search history.

(56) References Cited

U.S. PATENT DOCUMENTS

| | | | | |
|---|---|---|---|---|
| 8,947,840 B1* | 2/2015 | Milirud | ................. | H02H 9/046 361/56 |
| 2004/0251983 A1* | 12/2004 | Hsu | ......................... | H03H 7/38 333/32 |
| 2013/0229211 A1* | 9/2013 | Nishiyama | .......... | H04L 25/0274 327/146 |

(Continued)

FOREIGN PATENT DOCUMENTS

KR  1020160061689 A  6/2016

*Primary Examiner* — Kevin J Comber
(74) *Attorney, Agent, or Firm* — William Park & Associates Ltd.

(57) ABSTRACT

A semiconductor system includes a control device, and a semiconductor apparatus coupled with the control device through a first line and a second line. A loading of the second line is greater than a loading of the first line, wherein the semiconductor apparatus includes a first receiving circuit which is electrically coupled with the first line and a second receiving circuit which is electrically coupled with the second line. Further a loading between the first line and the first receiving circuit is greater than a loading between the second line and the second receiving circuit.

3 Claims, 2 Drawing Sheets

(56) References Cited

U.S. PATENT DOCUMENTS

| | | | |
|---|---|---|---|
| 2015/0049448 A1* | 2/2015 | Uehara | H01L 25/0657 361/767 |
| 2016/0147250 A1* | 5/2016 | Kong | G11C 29/023 713/401 |

* cited by examiner

SEMICONDUCTOR APPARATUS AND SYSTEM

CROSS-REFERENCES TO RELATED APPLICATION

The present application claims priority under 35 U.S.C. § 119(a) to Korean application number 10-2017-0071783, filed on Jun. 8, 2017, in the Korean Intellectual Property Office, which is incorporated herein by reference in its entirety.

BACKGROUND

1. Technical Field

Various embodiments generally relate to a semiconductor integrated circuit, and, more particularly, to a semiconductor apparatus and system.

2. Related Art

A semiconductor apparatus is configured to receive electrical signals through signal lines which are constructed by metals.

The semiconductor apparatus is configured such that electrical signals are inputted/outputted at predetermined times according to mounting circumstances, that is, the lengths (loadings) of the signal lines.

SUMMARY

In an embodiment, a semiconductor system may include: a control device; and a semiconductor apparatus coupled with the control device through a first line and a second line, wherein a loading of the second line is greater than a loading of the first line, wherein the semiconductor apparatus includes a first receiving circuit which is electrically coupled with the first line and a second receiving circuit which is electrically coupled with the second line, and wherein a loading between the first line and the first receiving circuit is greater than a loading between the second line and the second receiving circuit.

In an embodiment, a semiconductor apparatus may include: a first external connection terminal electrically coupled with a control device through a first line; a second external connection terminal electrically coupled with the control device through a second line; a first receiving circuit electrically coupled with the first external connection terminal; and a second receiving circuit electrically coupled with the second external connection terminal, wherein a number of capacitors which are coupled between the first external connection terminal and the first receiving circuit is different than the number of capacitors which are coupled between the second external connection terminal and the second receiving circuit.

In an embodiment a semiconductor system may also include: a control device; a first semiconductor apparatus coupled with the control device through a first line and a second line; a second semiconductor apparatus coupled with the control device through the second line and a third line. A loading on the second line is greater than a loading on either the first line or the third line.

DETAILED DESCRIPTION

Hereinafter, a semiconductor apparatus and system will be described below with reference to the accompanying drawings through various example embodiments.

Figure 1:
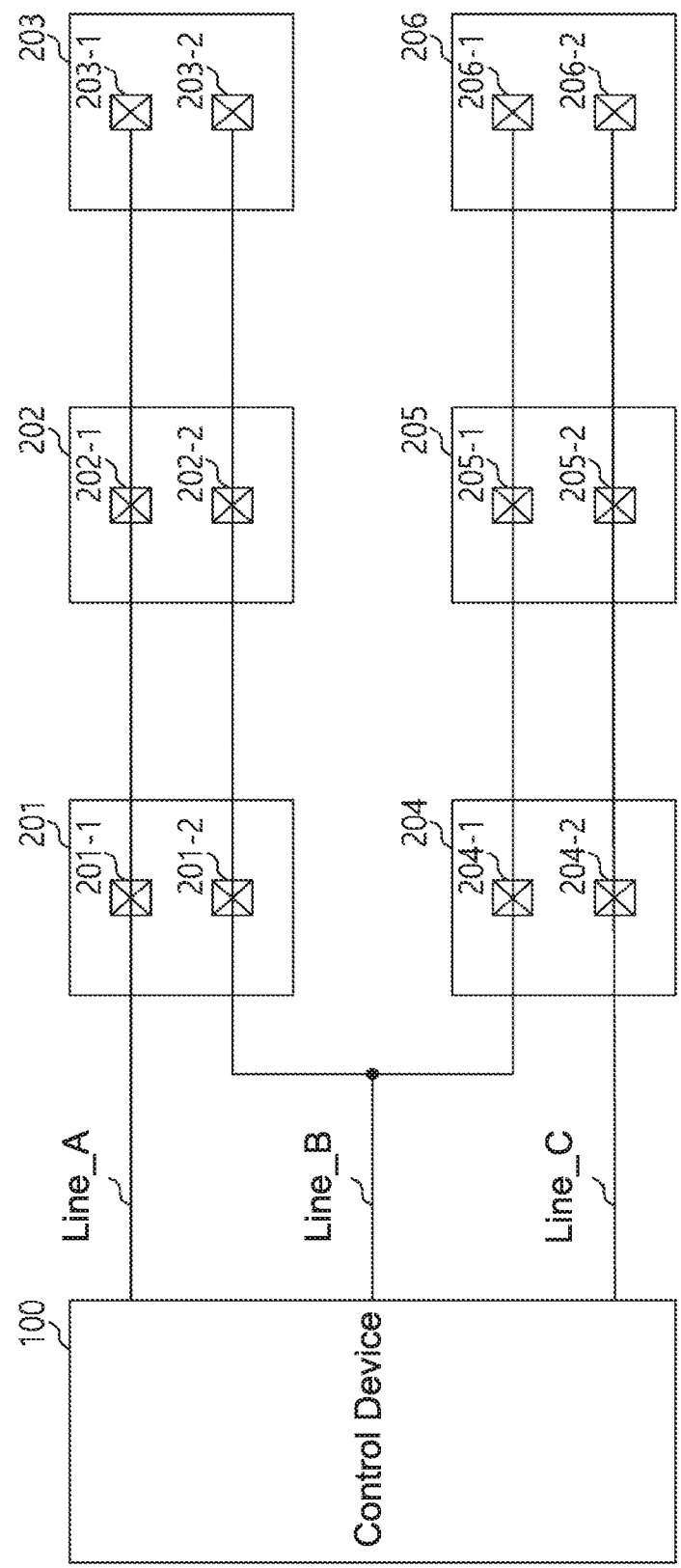
FIG. 1 is a configuration diagram illustrating a representation of an example of a semiconductor system in accordance with an embodiment.

As shown in FIG. 1, a semiconductor system in accordance with an embodiment may include a control device 100 and first to sixth semiconductor apparatuses 201, 202, 203, 204, 205, and 206.

The control device 100 may be a device which controls operations of the first to sixth semiconductor apparatuses 201, 202, 203, 204, 205, and 206. For example, the control device 100 may be one among devices which control operations of other circuits, such as a controller and a central processing unit.

The first to sixth semiconductor apparatuses 201, 202, 203, 204, 205, and 206 may be apparatuses which operate under control of the control device 100. For example, each of the first to sixth semiconductor apparatuses 201, 202, 203, 204, 205 and 206 may be a memory apparatus which is configured by semiconductor elements.

The control device 100 may be electrically coupled with the first to third semiconductor apparatuses 201, 202, and 203 through a first line Line_A and a second line Line_B. The control device 100 may be electrically coupled with the fourth to sixth semiconductor apparatuses 204, 205, and 206 through the second line Line_B and a third line Line_C.

The first semiconductor apparatus 201 may include a first external connection terminal 201-1 which is electrically coupled with the first line Line_A and a second external connection terminal 201-2 which is electrically coupled with the second line Line_B. The first external connection terminal 201-1 may be electrically coupled with the control device 100 through the first line Line_A, and the second external connection terminal 201-2 may be electrically coupled with the control device 100 through the second line Line_B.

The second semiconductor apparatus 202 may include a third external connection terminal 202-1 which is coupled with the first line Line_A and a fourth external connection terminal 202-2 which is coupled with the second line Line_B. The third external connection terminal 202-1 may be electrically coupled with the control device 100 through the first line Line_A, and the fourth external connection terminal 202-2 may be electrically coupled with the control device 100 through the second line Line_B.

The third semiconductor apparatus 203 may include a fifth external connection terminal 203-1 which is coupled with the first line Line_A and a sixth external connection terminal 203-2 which is coupled with the second line Line_B. The fifth external connection terminal 203-1 may be electrically coupled with the control device 100 through the first line Line_A, and the sixth external connection terminal 203-2 may be electrically coupled with the control device 100 through the second line Line_B.

The fourth semiconductor apparatus 204 may include a seventh external connection terminal 204-1 which is coupled with the second line Line_B and an eighth external connection terminal 204-2 which is coupled with the third line Line_C. The seventh external connection terminal 204-1 may be electrically coupled with the control device 100 through the second line Line_B, and the eighth external connection terminal 204-2 may be electrically coupled with the control device 100 through the third line Line_C.

The fifth semiconductor apparatus 205 may include a ninth external connection terminal 205-1 which is coupled with the second line Line_B and a tenth external connection terminal 205-2 which is coupled with the third line Line_C. The ninth external connection terminal 205-1 may be electrically coupled with the control device 100 through the second line Line_B, and the tenth external connection terminal 205-2 may be electrically coupled with the control device 100 through the third line Line_C.

The sixth semiconductor apparatus 206 may include an eleventh external connection terminal 206-1 which is coupled with the second line Line_B and a twelfth external connection terminal 206-2 which is coupled with the third line Line_C. The eleventh external connection terminal 206-1 may be electrically coupled with the control device 100 through the second line Line_B, and the twelfth external connection terminal 206-2 may be electrically coupled with the control device 100 through the third line Line_C.

Each of the first to sixth semiconductor apparatuses 201, 202, 203, 204, 205, and 206 is configured to receive signals from the control device 100 through lines coupled with respective external connection terminals. Each of the first to twelfth external connection terminals 201-1, 201-2, 202-1, 202-2, 203-1, 203-2, 204-1, 204-2, 205-1, 205-2, 206-1, and 206-2 may include a pad or a ball.

Figure 2:
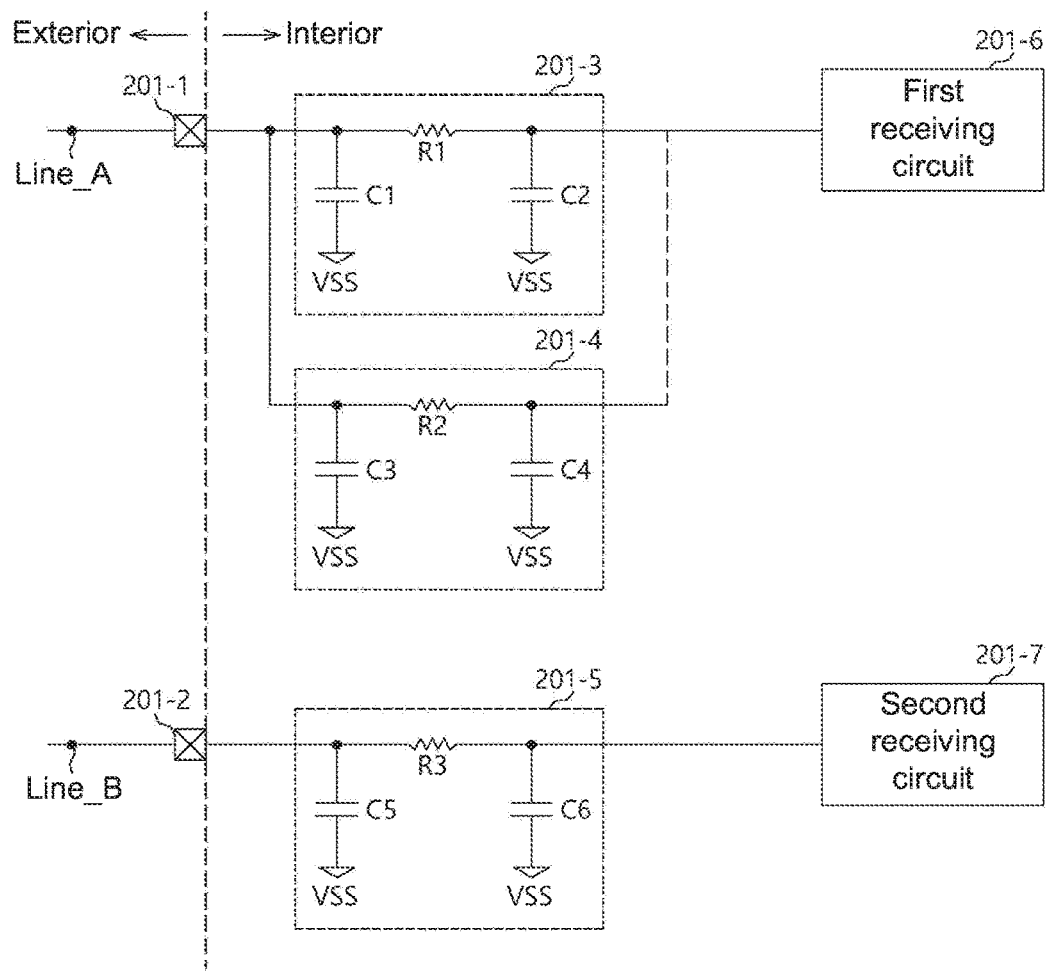
FIG. 2 is a configuration diagram illustrating a representation of an example of a semiconductor apparatus of FIG. 1.

As shown in FIG. 2, the first semiconductor apparatus 201 which includes the first and second external connection terminals 201-1 and 201-2 respectively coupled with the first and second lines Line_A and Line_B may include a first electrostatic discharge protection circuit 201-3, an additional capacitance circuit 201-4, a second electrostatic discharge protection circuit 201-5, a first receiving circuit 201-6, and a second receiving circuit 201-7.

The first electrostatic discharge protection circuit 201-3 is coupled between the first external connection terminal 201-1 and the first receiving circuit 201-6 to prevent the breakdown of the first receiving circuit 201-6 due to static electricity which may be introduced by the first external connection terminal 201-1.

The first electrostatic discharge protection circuit 201-3 may include a first resistor R1 and first and second capacitors C1 and C2. The first resistor R1 has one end to which the first external connection terminal 201-1 is coupled and an other end to which the first receiving circuit 201-6 is coupled. The first capacitor C1 has one end to which the one end of the first resistor R1 is coupled and an other end to which a ground terminal VSS is coupled. The second capacitor C2 has one end to which the other end of the first resistor R2 is coupled and an other end to which the ground terminal VSS is coupled.

The additional capacitance circuit 201-4 may be disposed to increase a loading of a line which couples the first external connection terminal 201-1 and the first receiving circuit 201-6. In other words, the additional capacitance circuit 201-4 may include capacitors C3 and C4 to increase a loading between the first external connection terminal 201-1 and the first receiving circuit 201-6. For example, the additional capacitance circuit 201-4 may be coupled between the first external connection terminal 201-1 and the first electrostatic discharge protection circuit 201-3. The additional capacitance circuit 201-4 may include a second resistor R2 and third and fourth capacitors C3 and C4. The second resistor R2 has one end to which the first external connection terminal 201-1 is coupled and an other end which is not coupled with another node and may be open. Alternatively, the second resistor R2 may have one end to which the first external connection terminal 201-1 is coupled and the other end may be coupled to the first receiving circuit 201-6. The third capacitor C3 has one end to which the one end of the second resistor R2 is coupled and an other end to which the ground terminal VSS is coupled. The fourth capacitor C4 has one end to which the other end of the second resistor R2 is coupled and the other end to which the ground terminal VSS is coupled. Further, a number of capacitors C1, C2, C3, and C4 which are coupled between the first external connection terminal 201-1 and the first receiving circuit 201-6 is a sum of a number of capacitors C1 and C2 of the first electrostatic discharge protection circuit 201-3 and the number of capacitors C3 and C4 of the additional capacitance circuit 201-4.

The second electrostatic discharge protection circuit 201-5 is coupled between the second external connection terminal 201-2 and the second receiving circuit 201-7 to prevent breakdown of the second receiving circuit 201-7 due to static electricity which may be introduced by the second external connection terminal 201-2.

The second electrostatic discharge protection circuit 201-5 may include a third resistor R3 and fifth and sixth capacitors C5 and C6. The third resistor R3 has one end to which the second external connection terminal 201-2 is coupled and an other end to which the second receiving circuit 201-7 is coupled. The fifth capacitor C5 has one end to which the one end of the third resistor R3 is coupled and an other end to which the ground terminal VSS is coupled. The sixth capacitor C6 has one end to which the other end of the third resistor R3 is coupled and an other end to which the ground terminal VSS is coupled. Further, the number of capacitors C5 and C6 coupled between the second external connection terminal 201-2 and the second receiving circuit 201-7 may be equal to the number of capacitors C5 and C6 of the second electrostatic discharge protection circuit 201-5. Further, a number of capacitors C1, C2, C3, and C4 coupled between the first external connection terminal 201-1 and the first receiving circuit 201-6 may be different than the number of capacitors C3 and C4 coupled between the second external connection terminal 201-2 and the second receiving circuit 201-7. In one example, the number of capacitors C1, C2, C3, and C4 coupled between the first external connection terminal 201-1 and the first receiving circuit 201-6 may be greater than the number of capacitors C3 and C4 coupled between the second external connection terminal 201-2 and the second receiving circuit 201-7.

The first receiving circuit 201-6 may be electrically coupled with the first line Line_A. The first receiving circuit 201-6 may receive a signal inputted through the first external connection terminal 201-1 or output a signal to the first external connection terminal 201-1.

The second receiving circuit 201-7 may be electrically coupled with the second line Line_B. The second receiving circuit 201-7 may receive a signal inputted through the second external connection terminal 201-2 or output a signal to the second external connection terminal 201-2.

The second to sixth semiconductor apparatuses 202, 203, 204, 205, and 206 may be configured in substantially the same manner as the first semiconductor apparatus 201. That is to say, each of the first to sixth semiconductor apparatuses 201, 202, 203, 204, 205, and 206 may be embodied such that capacitances between respective external connection terminals and receiving circuits coupled therewith are different from each other.

The operations of the semiconductor apparatus and system in accordance with an embodiment, configured as mentioned above, will be described below.

Making descriptions with reference to FIG. 1, the control device 100 and the first to third semiconductor apparatuses 201, 202, and 203 are electrically coupled through the first line Line_A and the second line Line_B. The control device 100 and the fourth to sixth semiconductor apparatuses 204, 205, and 206 may be electrically coupled through the second line Line_B and the third line Line_C.

As shown in FIG. 1, while the lengths of the first line Line_A and the third line Line_C are the same as each other, the length of the second line Line_B is longer than the length of each of the first line Line_A and the third line Line_C. Therefore, the loading of the second line Line_B is greater than the loading of each of the first line Line_A and the third line Line_C. Further, a loading between the first line Line_A and the first receiving circuit 201-6 may be greater than a loading between the second line Line_B and the second receiving circuit 201-7.

Thus, even when signals transmitted through the first and second lines Line_A and Line_B are outputted at the same time from the control device 100, the signals may reach the respective external connection terminals 201-1, 201-2, 202-1, 202-2, 203-1, and 203-2 of the first to third semiconductor apparatuses 201, 202 and 203 at different times. For example, the signals outputted from the control device 100 may reach the first external connection terminal 201-1 of the first semiconductor apparatus 201 and the second external connection terminal 201-2 of the first semiconductor apparatus 201 at different times. The signals outputted from the control device 100 may reach the third external connection terminal 202-1 of the second semiconductor apparatus 202 and the fourth external connection terminal 202-2 of the second semiconductor apparatus 202 at different times. The signals outputted from the control device 100 may reach the fifth external connection terminal 203-1 of the third semiconductor apparatus 203 and the sixth external connection terminal 203-2 of the third semiconductor apparatus 203 at different times. That is to say, signals may reach respective external connection terminals 201-1, 202-1, and 203-1 through the first line Line_A from the control device 100 faster than signals transmitted through respective external connection terminals 201-2, 202-2, and 203-2 through the second line Line_B from the control device 100.

Referring to FIG. 2, the first semiconductor apparatus 201 is configured such that a signal transferred through the first line Line_A is inputted into the first receiving circuit 201-6 through the first external connection terminal 201-1. The first semiconductor apparatus 201 is configured such that a signal transferred through the second line Line_B is inputted into the second receiving circuit 201-7 through the second external connection terminal 201-2. In this regard, the first electrostatic discharge protection circuit 201-3 and the additional capacitance circuit 201-4 are disposed between the first external connection terminal 201-1 and the first receiving circuit 201-6, and only the second electrostatic discharge protection circuit 201-5 is disposed between the second external connection terminal 201-2 and the second receiving circuit 201-7. In other words, the loading between the first external connection terminal 201-1 and the first receiving circuit 201-6 is greater than the loading between the second external connection terminal 201-2 and the second receiving circuit 201-7 due to the capacitance of the additional capacitance circuit 201-4. In other words, a loading between the first line Line_A and the first receiving circuit 201-6 may be greater than a loading between the second line Line_B and the second receiving circuit 201-7. Thus, a timing at which a signal reaches the first receiving circuit 201-6 from the first external connection terminal 201-1 is slower than a timing at which a signal reaches the second receiving circuit 201-7 from the second external connection terminal 201-2.

As a result, a time that a signal is transferred from the control device 100 to the first external connection terminal 201-1 of the first semiconductor apparatus 201 through the first line Line_A is faster than a time that a signal is transferred from the control device 100 to the second external connection terminal 201-2 of the first semiconductor apparatus 201 through the second line Line_B. Also, because of the capacitance of the additional capacitance circuit 201-4 disposed in the first semiconductor apparatus 201, the time that a signal transferred to the first receiving circuit 201-6 from the first external connection terminal 201-1 is slower than the time of a signal transferred to the second receiving circuit 201-7 from the second external connection terminal 201-2.

Hence, times that the signals outputted through the first and second lines Line_A and the Line_B from the control device 100 reach the first and second receiving circuits 201-6 and 201-7 may be the same as each other.

Further, in the second and third semiconductor apparatuses 202 and 203 which are configured in substantially the same manner as the first semiconductor apparatus 201, times that the signals outputted from the control device 100 reach respective receiving circuits included in the second and third semiconductor apparatuses 202 and 203 may be the same as each other.

Furthermore, although the fourth to sixth semiconductor apparatuses 204, 205, and 206 do not receive signals through the same lines as the first to third semiconductor apparatuses 201, 202, and 203 from the control device 100, each of the fourth to sixth semiconductor apparatuses 204, 205, and 206 which receives signals through the second line Line_B and the third line Line_C may also be configured in substantially the same manner as the semiconductor apparatuses 201, 202, and 203 of the first semiconductor apparatus 201, and substantially the same operation and substantially the same effect may be achieved.

In an embodiment, the loading of a signal line through which a signal is transferred from a control device to a receiving circuit inside a semiconductor apparatus is controlled by adding an additional capacitance in the semiconductor apparatus. As a consequence, even when signals are transferred to the same semiconductor apparatus from an exterior are inputted through signal lines having different loadings, it is possible to make times that the signals reach receiving circuits in the semiconductor apparatus, the same.

Figure 3:
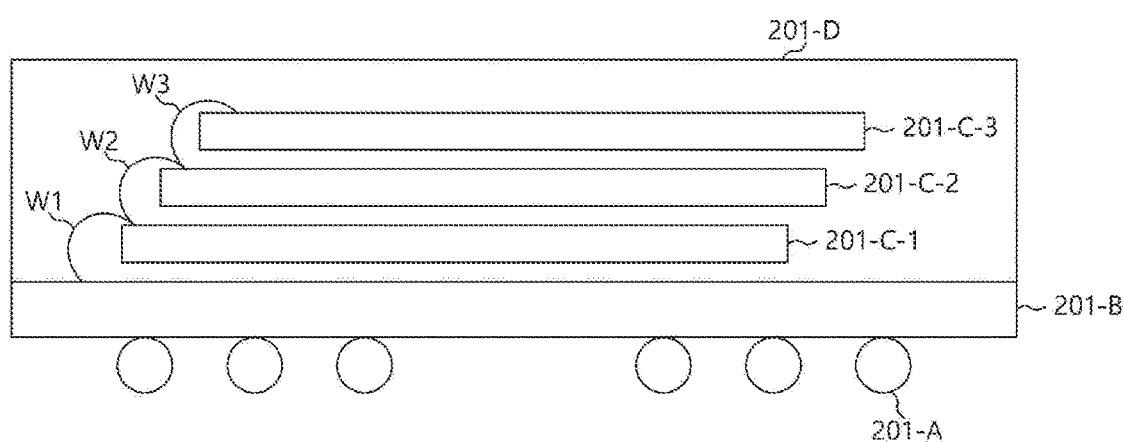
FIG. 3 is a configuration diagram illustrating a representation of an example of the semiconductor apparatus of FIG. 1.

As shown in FIG. 3, each of the first to sixth semiconductor apparatuses 201, 202, 203, 204, 205, and 206 may be a packaged semiconductor apparatus. The respective first to sixth semiconductor apparatuses 201, 202, 203, 204, 205, and 206 may be configured in substantially the same manner, and thus, only the first semiconductor apparatus 201 will be described below representatively.

The first semiconductor apparatus 201 may include a package substrate 201-B which includes external connection terminals 201-A, first to third semiconductor chips 201-C-1, 201-C-2, and 201-C-3 which are stacked on the package substrate 201-B, and a molding structure 201-D which molds the first to third semiconductor chips 201-C-1, 201-C-2, and 201-C-3 stacked on the package substrate 201-B. The first semiconductor chip 201-C-1 and the package substrate 201-B are electrically coupled through a first wire W1, the first semiconductor chip 201-C-1 and the second semiconductor chip 201-C-2 are electrically coupled through a second wire W2, and the second semiconductor chip 201-C-2 and the third semiconductor chip 201-C-3 are electrically coupled through a third wire W3.

If the first semiconductor apparatus 201 is a packaged semiconductor apparatus, by disposing additional capacitance circuits in receiving circuits coupled with the wires of the first to third semiconductor chips 201-C-1, 201-C-2 and 201-C-3 which are stacked, the technical principle of the present disclosure may be applied even in a stacked semiconductor apparatus.

While various embodiments have been described above, it will be understood by those skilled in the art that the embodiments described are examples only. Accordingly, the semiconductor apparatus and system described herein should not be limited based on the described embodiments.

What is claimed is:

1. A semiconductor memory apparatus comprising:
a first external connection terminal configured to be electrically coupled to a control device for the semiconductor memory apparatus through a first line having a first length and an associated first load;
a second external connection terminal configured to be electrically coupled to the control device through a second line having a second length and an associated second load, the second length being greater than the first length and the second load being greater than the first load;
a first receiving circuit;
a second receiving circuit;
a first electrostatic discharge circuit coupled between the first external connection terminal and the first receiving circuit;
a second electrostatic discharge circuit coupled between the second external connection terminal and the second receiving circuit; and
a passive and internal load compensation circuit coupled to the first external connection terminal, the passive and internal load compensation circuit being configured to add capacitive load at the first external terminal;
wherein the first associated load of the first line combined with the capacitive load provided by the passive and internal load compensation circuit is substantially equal to the second associated load of the second conductor;
wherein the passive and internal load compensation circuit is a capacitance and a resistance; and
wherein the passive and internal load compensation circuit and the first electrostatic discharge circuit are electrically parallel to each other and both are connected between the first external connection terminal and the first receiving circuit.

2. The semiconductor apparatus according to claim 1, wherein both the first and second electrostatic discharge circuits are capacitors and resistors.

3. The semiconductor apparatus according to claim 1, wherein a load on the second line is greater than a load on the first line.

* * * * *